(12) United States Patent
Radulescu

(10) Patent No.: US 9,343,561 B2
(45) Date of Patent: May 17, 2016

(54) SEMICONDUCTOR DEVICE WITH SELF-ALIGNED OHMIC CONTACTS

(71) Applicant: Cree, Inc., Durham, NC (US)

(72) Inventor: Fabian Radulescu, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/196,296

(22) Filed: Mar. 4, 2014

(65) Prior Publication Data

US 2014/0264381 A1    Sep. 18, 2014

Related U.S. Application Data

(63) Continuation-in-part of application No. 13/799,216, filed on Mar. 13, 2013, now Pat. No. 8,969,927.

(51) Int. Cl.
| | |
|---|---|
| *H01L 29/47* | (2006.01) |
| *H01L 29/778* | (2006.01) |
| *H01L 21/285* | (2006.01) |
| *H01L 29/06* | (2006.01) |
| *H01L 29/40* | (2006.01) |
| *H01L 29/423* | (2006.01) |
| *H01L 29/66* | (2006.01) |
| *H01L 29/812* | (2006.01) |
| *H01L 29/20* | (2006.01) |

(52) U.S. Cl.
CPC ........ *H01L 29/778* (2013.01); *H01L 21/28587* (2013.01); *H01L 29/0649* (2013.01); *H01L 29/401* (2013.01); *H01L 29/42316* (2013.01); *H01L 29/66462* (2013.01); *H01L 29/66863* (2013.01); *H01L 29/812* (2013.01); *H01L 29/2003* (2013.01)

(58) Field of Classification Search
CPC ............ H01L 29/402; H01L 29/42376; H01L 29/7786; H01L 29/7787
USPC ........... 438/172; 257/189–194, 471, E29.248
See application file for complete search history.

(56) References Cited

U.S. PATENT DOCUMENTS

| | | | |
|---|---|---|---|
| 4,889,827 | A | 12/1989 | Willers |
| 5,923,980 | A | 7/1999 | Gardner et al. |
| 6,316,793 | B1 | 11/2001 | Sheppard et al. |
| 6,407,002 | B1 | 6/2002 | Lin et al. |

(Continued)

FOREIGN PATENT DOCUMENTS

WO     2012047342 A2    4/2012

OTHER PUBLICATIONS

Notice of Allowance for U.S. Appl. No. 13/799,216, mailed Nov. 13, 2014, 7 pages.

(Continued)

*Primary Examiner* — Brook Kebede
(74) *Attorney, Agent, or Firm* — Myers Bigel & Sibley, P.A.

(57) ABSTRACT

A method of fabricating a semiconductor device includes providing one or more semiconductor layers, providing a gate contact on a first surface of the one or more semiconductor layers, then using the gate contact as a mask to deposit a source contact and a drain contact on the first surface of the one or more semiconductor layers, such that the source contact and the drain contact include an interior edge that is laterally aligned with a different lateral edge of the gate contact.

31 Claims, 18 Drawing Sheets

(56) References Cited

U.S. PATENT DOCUMENTS

| | | |
|---|---|---|
| 6,475,836 B1 | 11/2002 | Suzawa et al. |
| 6,740,599 B2 | 5/2004 | Yamazaki et al. |
| 7,550,783 B2 | 6/2009 | Wu et al. |
| 7,960,756 B2 | 6/2011 | Sheppard et al. |
| 8,114,717 B2 | 2/2012 | Palacios et al. |
| 8,283,699 B2 | 10/2012 | Wu |
| 8,357,571 B2 | 1/2013 | Radulescu et al. |
| 2002/0197846 A1 | 12/2002 | Suzawa et al. |
| 2004/0144991 A1 | 7/2004 | Kikkawa |
| 2007/0018199 A1* | 1/2007 | Sheppard et al. ............ 257/200 |
| 2007/0018210 A1 | 1/2007 | Sheppard |
| 2007/0164321 A1 | 7/2007 | Sheppard et al. |
| 2008/0157121 A1 | 7/2008 | Ohki |
| 2009/0159930 A1* | 6/2009 | Smorchkova et al. ........ 257/194 |
| 2009/0189187 A1 | 7/2009 | Briere et al. |
| 2010/0025730 A1 | 2/2010 | Heikman et al. |
| 2010/0171150 A1 | 7/2010 | Smith et al. |
| 2010/0276698 A1* | 11/2010 | Moore et al. .................... 257/76 |
| 2011/0057232 A1* | 3/2011 | Sheppard et al. ............ 257/194 |
| 2012/0049243 A1 | 3/2012 | Wu |

OTHER PUBLICATIONS

International Preliminary Report on Patentability for PCT/US2011/042933, mailed Mar. 21, 2013, 8 pages.

Ping, Andrew T. et al., "A High-Performance 0.13-μm AlGaAs/InGaAs pHEMT Process Using Sidewall Spacer Technology," 2005 CS MANTECH, 2005, 4 pages.

Nevers, Corey et al., "High-Volume 0.25 μm AlGaAs/InGaAs E/D pHEMT Process Utilizing Optical Lithography," CS MANTECH Conference, May 18-21, 2009, 4 pages, Tampa, Florida.

Sheppard, Scott et al., "High-Efficiency Amplifiers Using AlGaN/GaN HEMTs on SiC," CS MANTECH Conference, Apr. 24-27, 2006, pp. 175-178, Vancouver, British Columbia.

International Search Report for International Patent Application No. PCT/US11/42933, mailed Feb. 14, 2013, 6 pages.

Non-Final Office Action for U.S. Appl. No. 12/879,398, mailed Jun. 21, 2012, 12 pages.

Notice of Allowance for U.S. Appl. No. 12/879,398, mailed Oct. 24, 2012, 8 pages.

Non-Final Office Action for U.S. Appl. No. 13/799,216, mailed Jul. 23, 2014, 10 pages.

* cited by examiner

SEMICONDUCTOR DEVICE WITH SELF-ALIGNED OHMIC CONTACTS

RELATED APPLICATIONS

This application is a continuation-in-part of U.S. patent application Ser. No. 13/799,216, filed Mar. 13, 2013, the disclosure of which is hereby incorporated herein by reference in its entirety.

FIELD OF THE DISCLOSURE

The present disclosure relates to semiconductor devices including precise contact geometries.

BACKGROUND

A Schottky barrier device is a type of semiconductor device that utilizes the properties of a potential barrier formed between a metal-semiconductor junction to perform one or more functions. A typical Schottky barrier device may include a wide band-gap semiconductor layer, on which one or more metal contacts are placed to form a Schottky interface. Some exemplary Schottky barrier devices include Schottky diodes, high electron mobility transistors (HEMTs), and metal-semiconductor field-effect transistors (MESFETs). A HEMT incorporates a junction between one or more HEMT epilayers having a first band-gap and a semiconductor layer having a second band-gap (i.e., a heterojunction), at which a two-dimensional electron gas is formed, thereby creating a channel, which allows electrons to flow between a drain contact and a source contact. The potential barrier formed by a Schottky interface between a gate contact metal and the semiconductor layer is used to control the flow of electrons through the channel. Similarly, a MESFET uses a doped channel located in a semiconductor layer to allow electrons to flow between a drain contact and a source contact. Again, the potential barrier formed by a Schottky interface between a gate contact metal and the semiconductor layer is used to control the flow of electrons through the doped channel.

The geometry of the contact metal that forms the Schottky interface with the semiconductor layer may dictate several performance characteristics of the Schottky barrier device. For example, the speed of the Schottky barrier device may be directly related to the geometry of the contact metal. Generally, the smaller the area of the contact metal at the surface of the semiconductor layer where the Schottky interface is formed, the faster the Schottky barrier device can operate. Accordingly, many methods for forming contacts for a Schottky barrier device have focused on reducing the area of the contact metal at the surface of the semiconductor layer.

In addition to the geometry of the contact metal that forms the Schottky interface with the semiconductor layer, the distance between the source contact and the drain contact of a HEMT or MESFET may dictate additional performance characteristics of the Schottky barrier device. For example, the on resistance ($R_{ON}$) of the Schottky barrier device, as well as the turn on voltage ($V_{ON}$) of the Schottky barrier device, may be directly related to the distance between the source contact and the drain contact of the HEMT or MESFET. Accordingly, there is a need for Schottky barrier devices including precise contact geometries, and methods for manufacturing such devices.

SUMMARY

According to one embodiment, a Schottky barrier device includes one or more semiconductor layers, a gate contact, a drain contact, and a source contact. The drain contact and the source contact are on a first surface of the one or more semiconductor layers. The gate contact includes a proximal end on the first surface of the one or more semiconductor layers between the drain contact and the source contact, and a distal end opposite the proximal end. The gate contact is defined by a pair of tapered sidewalls that expand laterally as the gate contact extends vertically away from the proximal end, terminating in a pair of lateral edges at the distal end of the gate contact. Each lateral edge of the gate contact is laterally aligned with an interior lateral edge of either the drain contact or the source contact, respectively, such that a vertical gap exists between each laterally aligned edge of the gate contact and the respective edge of either the drain contact or the source contact. By aligning an interior edge of the drain contact and the source contact with a different lateral edge of the gate contact, the distance between the drain contact and the source contact can be precisely controlled, thereby improving the performance of the Schottky barrier device.

According to one embodiment, a method of fabricating a semiconductor device includes providing one or more semiconductor layers, providing a gate contact on a first surface of the one or more semiconductor layers, then using the gate contact as a mask to deposit a source contact and a drain contact on the first surface of the one or more semiconductor layers, such that the source contact and the drain contact include an interior edge that is laterally aligned with a different lateral edge of the gate contact. The gate contact includes a proximal end on the first surface of the one or more semiconductor layers, and a distal end opposite the proximal end. The gate contact is defined by a pair of tapered sidewalls that expand laterally as the gate contact extends vertically away from the proximal end, terminating in a pair of lateral edges at the distal end of the gate contact, such that a vertical gap exists between each laterally aligned edge of the gate contact and the respective edge of either the drain contact or the source contact.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
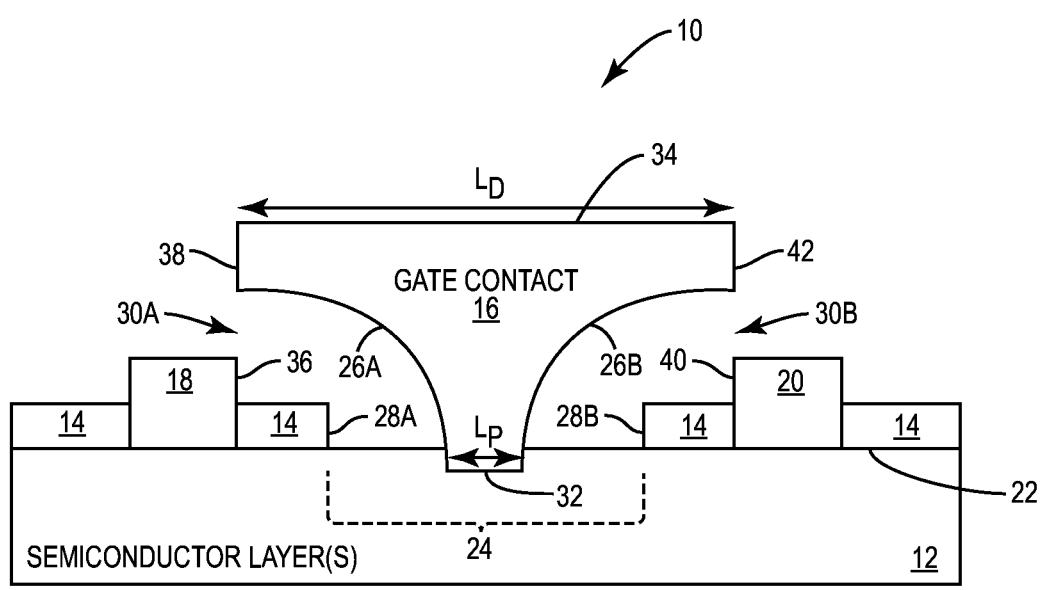
FIG. 1 shows a two-dimensional representation of a Schottky barrier device according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Turning now to FIG. 1, a Schottky barrier device 10 is shown according to one embodiment of the present disclosure. The Schottky barrier device 10 includes one or more semiconductor layers 12, a dielectric layer 14, a gate contact 16, a source contact 18, and a drain contact 20. The dielectric layer 14 is on a first surface 22 of the one or more semiconductor layers 12, and includes a first opening 24 through which a first portion of the first surface 22 of the one or more semiconductor layers 12 is exposed. The dielectric layer 14 may comprise any desired dielectric or insulator material, as will be appreciated by those of ordinary skill in the art. The dielectric layer 14 may act as a passivation layer, which increases the high frequency performance of the Schottky barrier device 10. In some embodiments, the dielectric layer 14 may be omitted. According to one embodiment, the length of the first opening 24 is below about 0.4 µm. The gate contact 16 is in contact with the first portion of the first surface 22 of the one or more semiconductor layers 12 exposed through the first opening 24. The gate contact 16 is tapered, such that the gate contact 16 expands laterally as it extends vertically away from the first surface 22 of the one or more semiconductor layers 12. The gate contact 16 includes a first sidewall 26A and a second sidewall 26B, which are each separated from a first sidewall 28A and a second sidewall 28B of the first opening 24, the dielectric layer 14, and the one or more semiconductor layers 12 by a first air region 30A and a second air region 30B, respectively. Further, the gate contact includes a proximal end 32 that is on, and preferably directly on, the portion of the one or more semiconductor layers 12 exposed through the first opening 24, and a distal end 34 opposite the proximal end 32. A length ($L_P$) of the proximal end 32 of the gate contact 16 is substantially less than a length ($L_D$) of the distal end 34 of the gate contact 16. The length ($L_P$) of the proximal end 32 of the gate contact 16 defines a gate length ($L_G$) of the Schottky barrier device 10.

As discussed in further detail below, the length ($L_P$) of the proximal end 32 of the gate contact 16, and thus the gate length ($L_G$) of the Schottky barrier device 10, is substantially less than that which is achievable using conventional means. More specifically, in one embodiment, the length ($L_P$) of the proximal end 32 of the gate contact 16 is below about 0.2 µm. According to an additional embodiment, the length ($L_P$) of the proximal end 32 of the gate contact 16 is below about 0.1 µm. As a result of the small gate length ($L_G$), a frequency response of the Schottky barrier device 10 is substantially improved as compared to conventional devices. According to one embodiment, the length ($L_D$) of the distal end 34 of the gate contact 16 is greater than or equal to about 0.4 µm.

As discussed above, the sidewalls 26 of the gate contact 16 are separated from the sidewalls 28 of the first opening 24, the dielectric layer 14, and the one or more semiconductor layers 12 by the corresponding air regions 30. As discussed in further detail below, the air regions 30 correspond to voids created by removing a sacrificial dielectric layer. The air regions 30 minimize or eliminate a parasitic capacitance between the gate contact 16 and the one or more semiconductor layers 12 that would otherwise be present if a dielectric material were present in the air regions 30. Further, the air regions 30 allow the source contact 18 and the drain contact 20 to be self-aligned. In other words, the air regions 30 significantly reduce alignment requirements for both the source contact 18 and the drain contact 20. As discussed in further detail below, rather than requiring very accurate and precise alignment to position the source contact 18 and the drain contact 20 on the dielectric layer 14 adjacent to the gate contact 16, the source contact 18 and the drain contact 20 may be formed by depositing a contact metal over a more general area that starts on the gate contact 16 and extends laterally over the first surface 22 of the one or more semiconductor layers 12 outwards towards the edges of the Schottky barrier device 10.

Specifically, the source contact 18 is on the first surface 22 of the one or more semiconductor layers 12. The source contact 18 includes a first lateral edge 36, which is approximately aligned with a first lateral edge 38 of the gate contact 16, leaving a vertical gap between the two. As discussed in further detail below, the alignment between the first lateral edge 36 of the source contact 18 and a first lateral edge 38 of the gate contact 16 is achieved by using the gate contact 16 as a mask when depositing the source contact 18. The drain contact 20 is also on the first surface 22 of the one or more semiconductor layers 12. The drain contact 20 also includes a first lateral edge 40, which is approximately aligned with a second lateral edge 42 of the gate contact 16, leaving a vertical gap between the two. As discussed in further detail below, the alignment between the first lateral edge 40 of the drain contact 20 and the second lateral edge 42 of the gate contact 16 is achieved by using the gate contact 16 as a mask when depositing the drain contact 20.

Aligning an edge of each one of the source contact 18 and the drain contact 20 with a different edge of the gate contact 16 allows the length ($L_{S-D}$) from the source contact 18 to the drain contact 20 to be about equal to the length ($L_D$) of the distal end 34 of the gate contact 16. Accordingly, the length ($L_{S-D}$) from the source contact 18 to the drain contact 20 is smaller than is otherwise achievable by conventional means. The small length ($L_{S-D}$) from the source contact 18 to the drain contact 20 allows for an improved on resistance ($R_{ON}$) of the Schottky barrier device 10, and may further improve the turn-on voltage ($V_{ON}$) of the Schottky barrier device 10.

According to one embodiment, the Schottky barrier device 10 is a high electron mobility transistor (HEMT). According to an additional embodiment, the Schottky barrier device 10 is a metal-semiconductor field-effect transistor (MESFET). Although the principles of the present disclosure are discussed with respect to Schottky barrier devices in general, the disclosure is not limited thereto. Those of ordinary skill in the art will appreciate that the principles of the present disclosure may be applied to any semiconductor device.

According to one embodiment, the one or more semiconductor layers 12 include multiple layers of the same or different semiconductor materials. The number and type of layers in the one or more semiconductor layers 12 may depend on the function of the Schottky barrier device 10, as discussed in further detail below.

Figure 2:
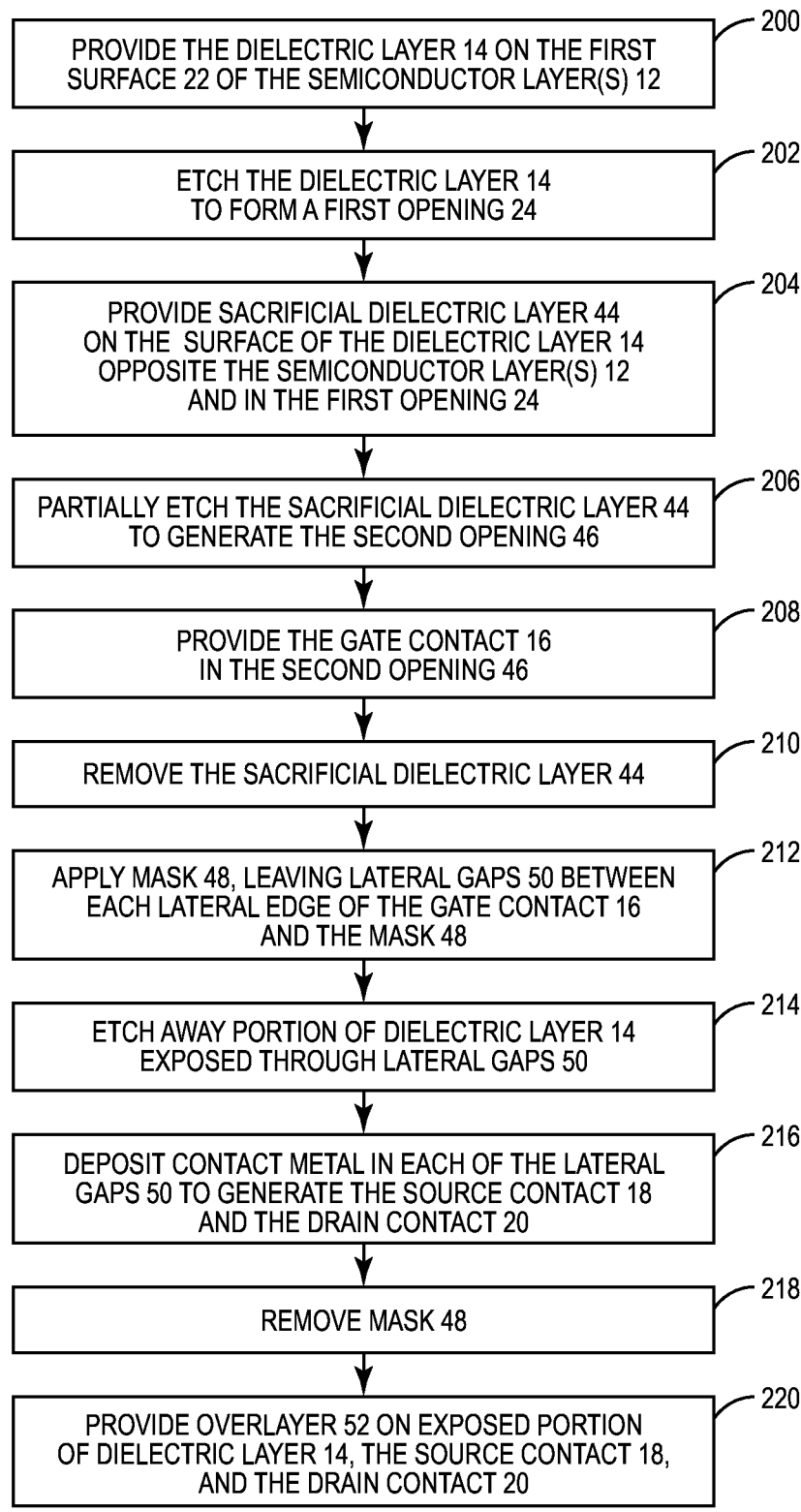
FIG. 2 shows a flow-chart illustrating a process for manufacturing the Schottky barrier device shown in FIG. 1.

FIG. 2 and corresponding FIGS. 3A through 3K illustrate a method of fabricating the Schottky barrier device shown in FIG. 1 according to one embodiment of the present disclosure. First, the dielectric layer 14 is provided on the first surface 22 of the one or more semiconductor layers 12 (step 200 and FIG. 3A). The dielectric layer 14 is then etched to form the first opening 24 (step 202 and FIG. 3B). In one embodiment, a photo-resist etching process is used to generate the first opening 24, in which a photo-mask is applied on the surface of the dielectric layer 14 opposite the one or more semiconductor layers 12, patterned, and the dielectric layer 14 is etched. Those of ordinary skill in the art will appreciate that many different processes may exist for etching the dielectric layer 14 to generate the first opening 24, all of which are contemplated herein. A sacrificial dielectric layer 44 is then provided on the surface of the dielectric layer 14 opposite the one or more semiconductor layers 12 and in the first opening 24 (step 204 and FIG. 3C). The sacrificial dielectric layer 44 is then partially etched to generate a second opening 46, through which a second portion of the first surface 22 of the one or more semiconductor layers 12 is exposed (step 206 and FIG. 3D). The second opening 46 is substantially smaller than the first opening 24, such that the second portion of the first surface 22 of the one or more semiconductor layers 12 exposed through the second opening 46 is substantially smaller than the first portion of the first surface 22 of the one or more semiconductor layers 12 exposed through the first opening 24. Further, the second opening 46 is tapered, such that the second opening 46 expands laterally as it extends vertically away from the first surface 22 of the one or more semiconductor layers 12. As discussed in co-pending U.S. patent application Ser. No. 13/799,216, which is herein incorporated by reference in its entirety, the sacrificial dielectric layer 44 may comprise multiple layers, each of which responds differently to the etching process in order to generate a desired geometry of the second opening 46.

Figure 3A:
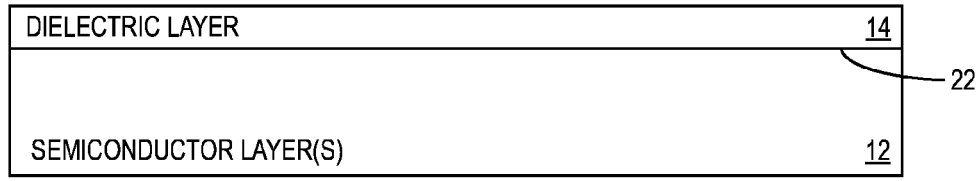
FIGS. 3A-3K illustrate a process for manufacturing the Schottky barrier device shown in FIG. 1 according to one embodiment of the present disclosure.
Figure 3B:
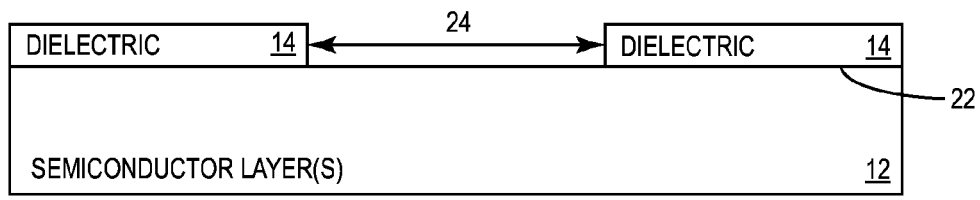
Figure 3C:
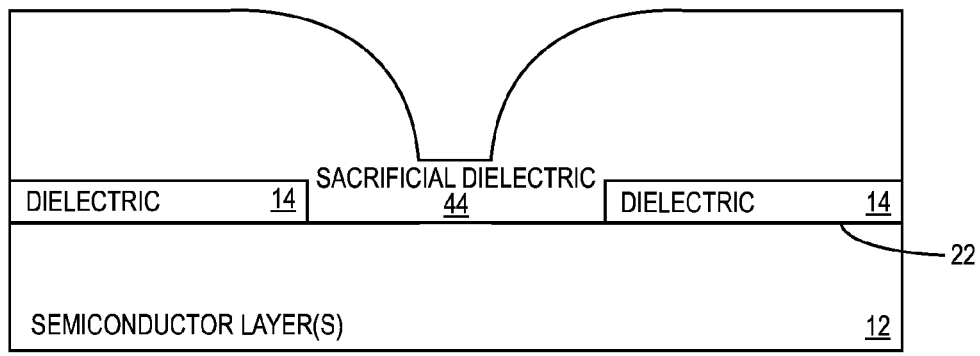
Figure 3D:
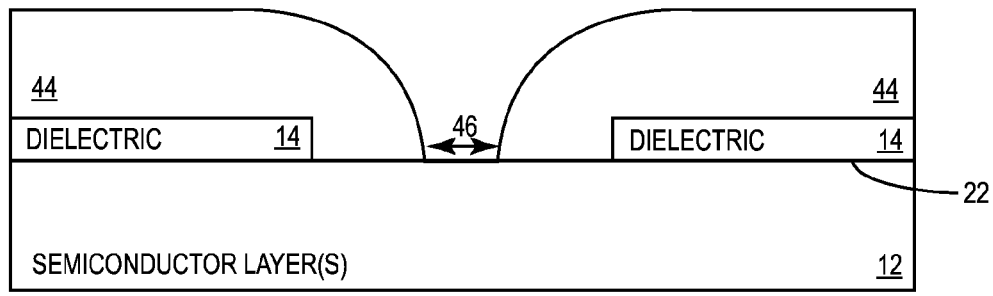
Figure 3E:
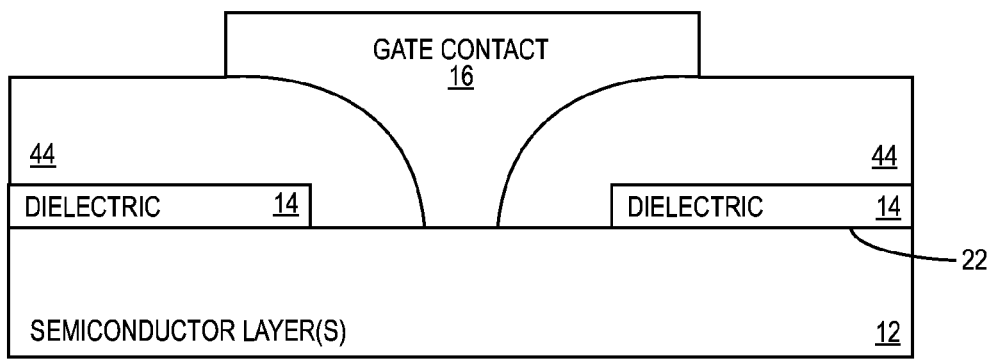
Figure 3F:
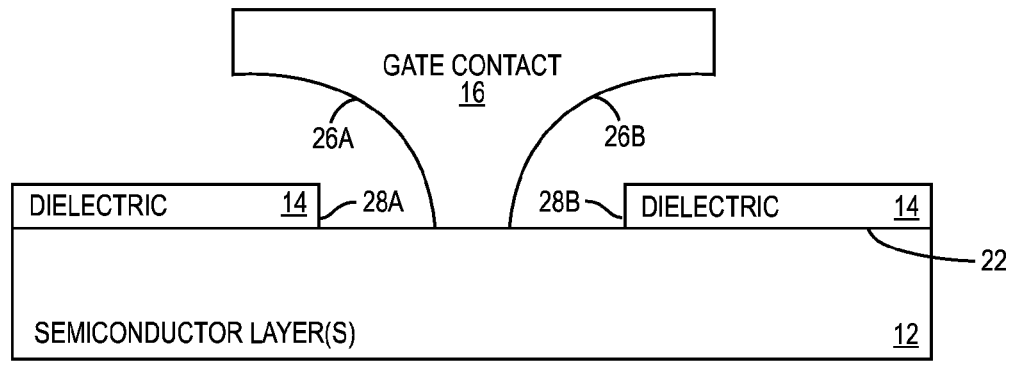
Figure 3G:
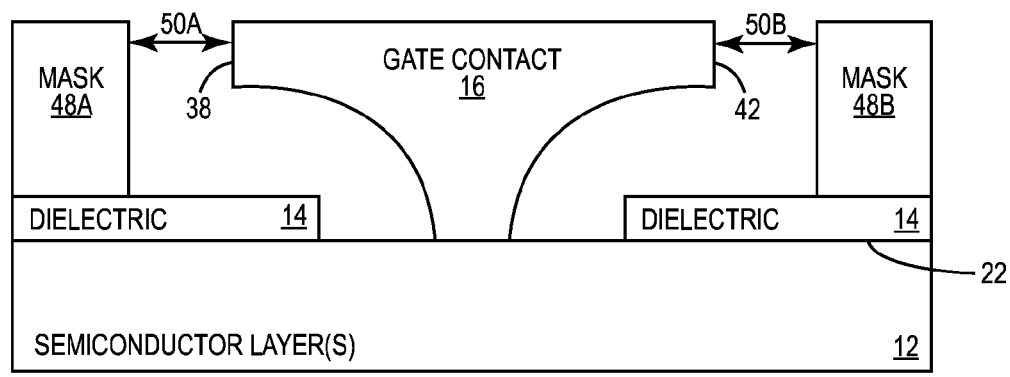
Figure 3H:
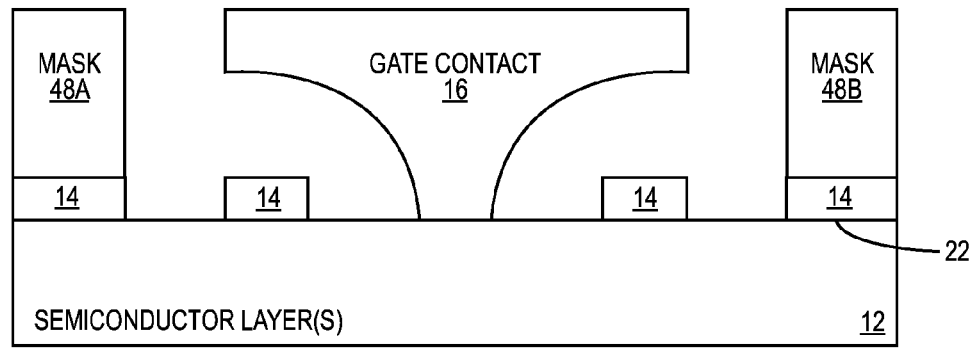
Figure 3I:
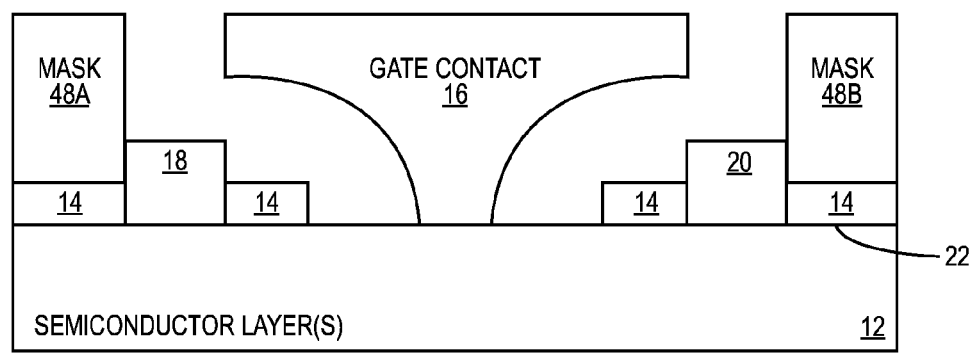
Figure 3J:
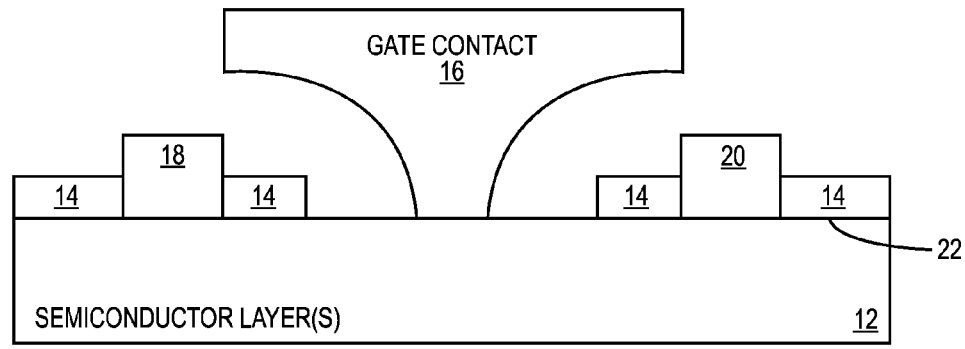
Figure 3K:
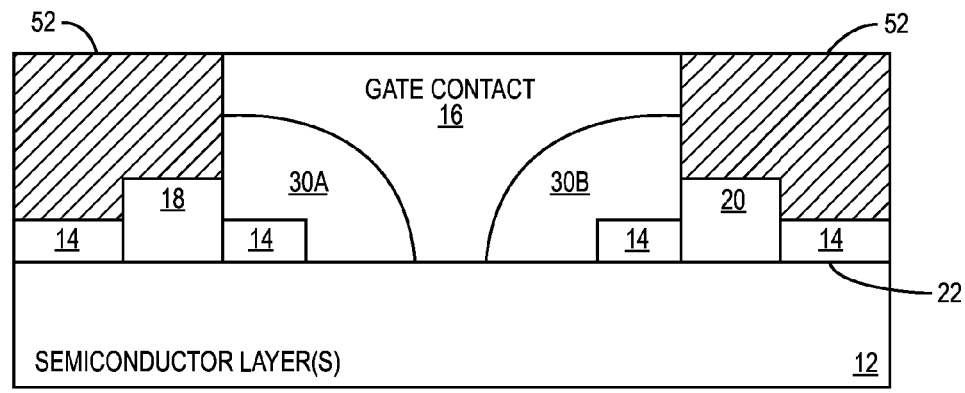

The gate contact 16 is then provided in the second opening 46 step 208 and FIG. 3E). Since the second opening 46 is tapered, the gate contact 16 is also tapered. The gate contact 16 may be provided, for example, by any suitable metal deposition process. As will be understood by those of ordinary skill in the art, a number of processes for providing the gate contact 16 may exist, all of which are contemplated herein. The sacrificial dielectric layer 44 is then removed, thereby generating the air regions 30 between the sidewalls 26 of the gate contact 16 and the sidewalls 28 of the first opening 24 (step 210 and FIG. 3F). In some embodiments, the dielectric layer 14 may also be removed (not shown). A mask 48 is then applied to the outer edges of the Schottky barrier device 10, such that a lateral gap 50 exists between each one of the first lateral edge 38 and the second lateral edge 42 of the gate contact 16 and the mask 48, through which a portion of the dielectric layer 14 is exposed (step 212 and FIG. 3G). Specifically, a first mask portion 48A is provided, which is separated from the first lateral edge 38 of the gate contact 16 by a first lateral gap 50A, and a second mask portion 48B is provided, which is separated from the second lateral edge 42 of the gate contact 16 by a second lateral gap 50B. In some embodiments where the dielectric layer 14 is not removed, an etching process is then performed to remove the portion of the dielectric layer 14 exposed through the lateral gaps 50 (step 214 and FIG. 3H). A contact metal is then deposited in each one of the lateral gaps 50 between the mask 48 and each one of the first lateral edge 38 and the second lateral edge 42 of the gate contact 16 to generate the source contact 18 and the drain contact 20 (step 216 and FIG. 3I).

Notably, the gate contact 16 is effectively used as part of the mask for generating the source contact 18 and the drain contact 20, thereby allowing the first lateral edge 36 of the source contact 18 to laterally align with the first lateral edge 38 of the gate contact 16, and allowing the first lateral edge 40 of the drain contact 20 to laterally align with the second lateral edge 42 of the gate contact 16. As discussed above, aligning an edge of each one of the source contact 18 and the drain contact 20 with a different edge of the gate contact 16 allows for an improved on resistance ($R_{ON}$) of the Schottky barrier device 10, and may further improve the gain, the transconductance, and the cut-off frequency of the Schottky barrier device 10. The mask 48 is then removed, for example, by an etching process (step 218 and FIG. 3J). Those of ordinary skill in the art will appreciate that many different processes exist for removing the mask 48, all of which are contemplated herein. According to one embodiment, an overlayer 52 is applied to the Schottky barrier device 10, such that the overlayer 52 covers the exposed portions of the dielectric layer 14, the source contact 18, and the drain contact 20, while maintaining the first air region 30A and the second air region 30B (step 220 and FIG. 3K). Accordingly, the Schottky barrier device 10 may be strengthened and protected against environmental exposure. The overlayer 52 may comprise any suitable material. For example, according to one embodiment, the overlayer 52 may comprise a dielectric film that is deposited under highly anisotropic conditions (e.g., sputtered or evaporated). Alternatively, a conformal dielectric layer may also be used as the overlayer 52.

Figure 4:
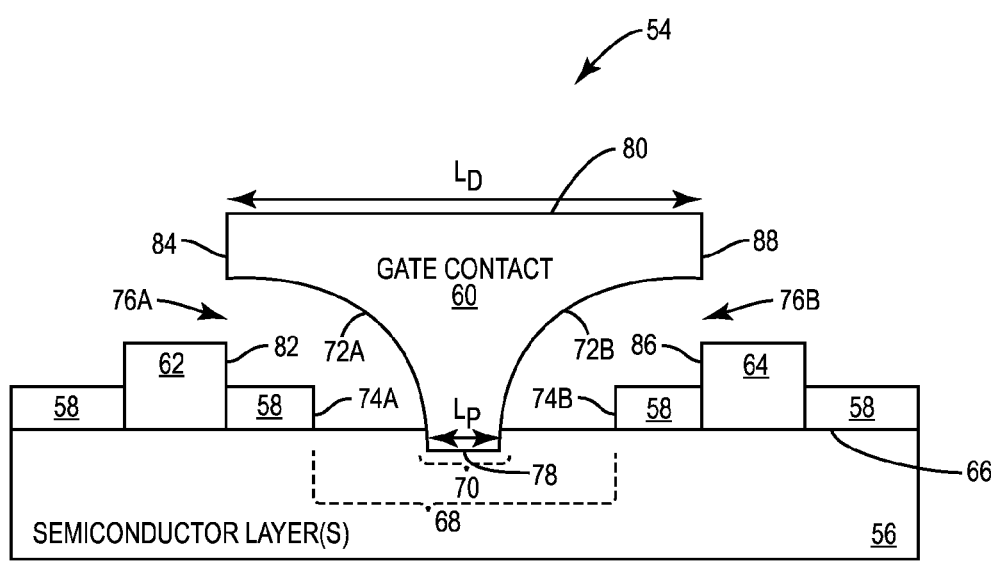
FIG. 4 shows a two-dimensional representation of a Schottky barrier device according to an additional embodiment of the present disclosure.

FIG. 4 shows a Schottky barrier device 54 according to an additional embodiment of the present disclosure. The Schottky barrier device 54 includes one or more semiconductor layers 56, a dielectric layer 58, a gate contact 60, a source contact 62, and a drain contact 64. The dielectric layer 58 is on a first surface 66 of the one or more semiconductor layers 56, and includes a first opening 68 through which a first portion of the first surface 66 of the one or more semiconductor layers 56 is exposed. The dielectric layer 58 may comprise any desired dielectric or insulator material, as will be appreciated by those of ordinary skill in the art. The dielectric layer 58 may act as a passivation layer, which increases the high frequency performance of the Schottky barrier device 10. In some embodiments, the dielectric layer 58 may be omitted. According to one embodiment, the length of the first opening 68 is below about 0.4 µm. The first portion of the first surface 66 of the one or more semiconductor layers 56 includes a recess 70, which extends from the first surface 66 of the one or more semiconductor layers 56 down to a desired depth ($D_R$). The gate contact 60 is provided in the recess 70, such that the gate contact is in contact with the first surface 66 of the one or more semiconductor layers 56 within the recess 70. The gate contact 60 is tapered, such that the gate contact 60 expands laterally as it extends vertically away from the first surface 66 of the one or more semiconductor layers 56. The gate contact 60 includes a first sidewall 72A and a second sidewall 72B, which are each separated from a first sidewall 74A and a second sidewall 74B of the first opening 68, the dielectric layer 58, and the one or more semiconductor layers 56 by a first air region 76A and a second air region 76B, respectively. Further, the gate contact 60 includes a proximal end 78 that is within, and preferably directly within, the recess 70 in the one or more semiconductor layers 56, and a distal end 80 opposite the proximal end 78. A length ($L_P$) of the proximal end 78 of the gate contact 60 is substantially less than a length ($L_D$) of the distal end 80 of the gate contact 60. The length ($L_P$) of the proximal end 78 of the gate contact 60 defines a gate length ($L_G$) of the Schottky barrier device 54.

As discussed in further detail below, the length ($L_P$) of the proximal end 78 of the gate contact 60, and thus the gate length ($L_G$) of the Schottky barrier device 54, is substantially less than that which is achievable using conventional means. More specifically, in one embodiment, the length ($L_P$) of the proximal end 78 of the gate contact 60 is below about 0.2 µm. According to an additional embodiment, the length ($L_P$) of the proximal end 78 of the gate contact 60 is below about 0.1 µm. As a result of the small gate length ($L_G$), a frequency response of the Schottky barrier device 54 is substantially improved as compared to conventional devices. According to one embodiment, the length ($L_D$) of the distal end 80 of the gate contact 60 is greater than or equal to about 0.4 µm.

As discussed above, the sidewalls 72 of the gate contact 60 are separated from the sidewalls 74 of the first opening 68 and from the dielectric layer 58 by corresponding air regions 76. As discussed in further detail below, the air regions 76 correspond to voids created by removing a sacrificial dielectric layer and, optionally, the dielectric layer 14. The air regions 76 minimize or eliminate a parasitic capacitance between the gate contact 60 and the one or more semiconductor layers 56 that would otherwise be present if a dielectric material were present in the air regions 76. Further, the air regions 76 allow the source contact 62 and the drain contact 64 to be self-aligned. In other words, the air regions 76 significantly reduce alignment requirements for both the source contact 62 and the drain contact 64. As discussed in further detail below, rather than requiring very accurate and precise alignment to position the source contact 62 and the drain contact 64, the source contact 62 and the drain contact 64 may be formed by depositing a contact metal over a more general area that starts on the gate contact 60 and extends laterally over the first surface of the one or more semiconductor layers 56 outwards towards the edges of the Schottky barrier device 54.

Specifically, the source contact 62 is on the first surface 66 of the one or more semiconductor layers 56. The source contact 62 includes a first lateral edge 82, which is approximately aligned with a first lateral edge 84 of the gate contact 60, leaving a vertical gap between the two. As discussed in further detail below, the alignment between the first lateral edge 82 of the source contact 62 and the first lateral edge 84 of the gate contact 60 is achieved by using the gate contact 60 as a mask when depositing the source contact 62. The drain contact 64 is also on the first surface 66 of the one or more semiconductor layers 56. The drain contact 64 includes a first lateral edge 86, which is approximately aligned with a second lateral edge 88 of the gate contact 60, leaving a vertical gap between the two. As discussed in further detail below, the alignment between the first lateral edge 86 of the drain contact 64 and the second lateral edge 88 of the gate contact 60 is achieved by using the gate contact 60 as a mask when depositing the drain contact 64.

Aligning an edge of each one of the source contact 62 and the drain contact 64 with a different edge of the gate contact 60 allows the length ($L_{S-D}$) from the source contact 62 to the drain contact 64 to be about equal to the length ($L_D$) of the distal end 80 of the gate contact 60. Accordingly, the length ($L_{S-D}$) from the source contact 62 to the drain contact 64 is smaller than is otherwise achievable by conventional means. The small length ($L_{S-D}$) from the source contact 62 to the drain contact 64 allows for an improved on resistance ($R_{ON}$) of the Schottky barrier device 54, and may further improve the gain, the transconductance, and the cut-off frequency of the Schottky barrier device 54.

According to one embodiment, the Schottky barrier device 54 is a HEMT. According to an additional embodiment, the Schottky barrier device 54 is a MESFET. Although the principles of the present disclosure are discussed with respect to Schottky barrier devices in general, the disclosure is not limited thereto. Those of ordinary skill in the art will appreciate that the principles of the present disclosure may be applied to any semiconductor device.

According to one embodiment, the one or more semiconductor layers 56 include multiple layers of the same or different semiconductor materials. The number and type of layers in the one or more semiconductor layers 56 may depend on the function of the Schottky barrier device 54, as discussed in further detail below.

Figure 5:
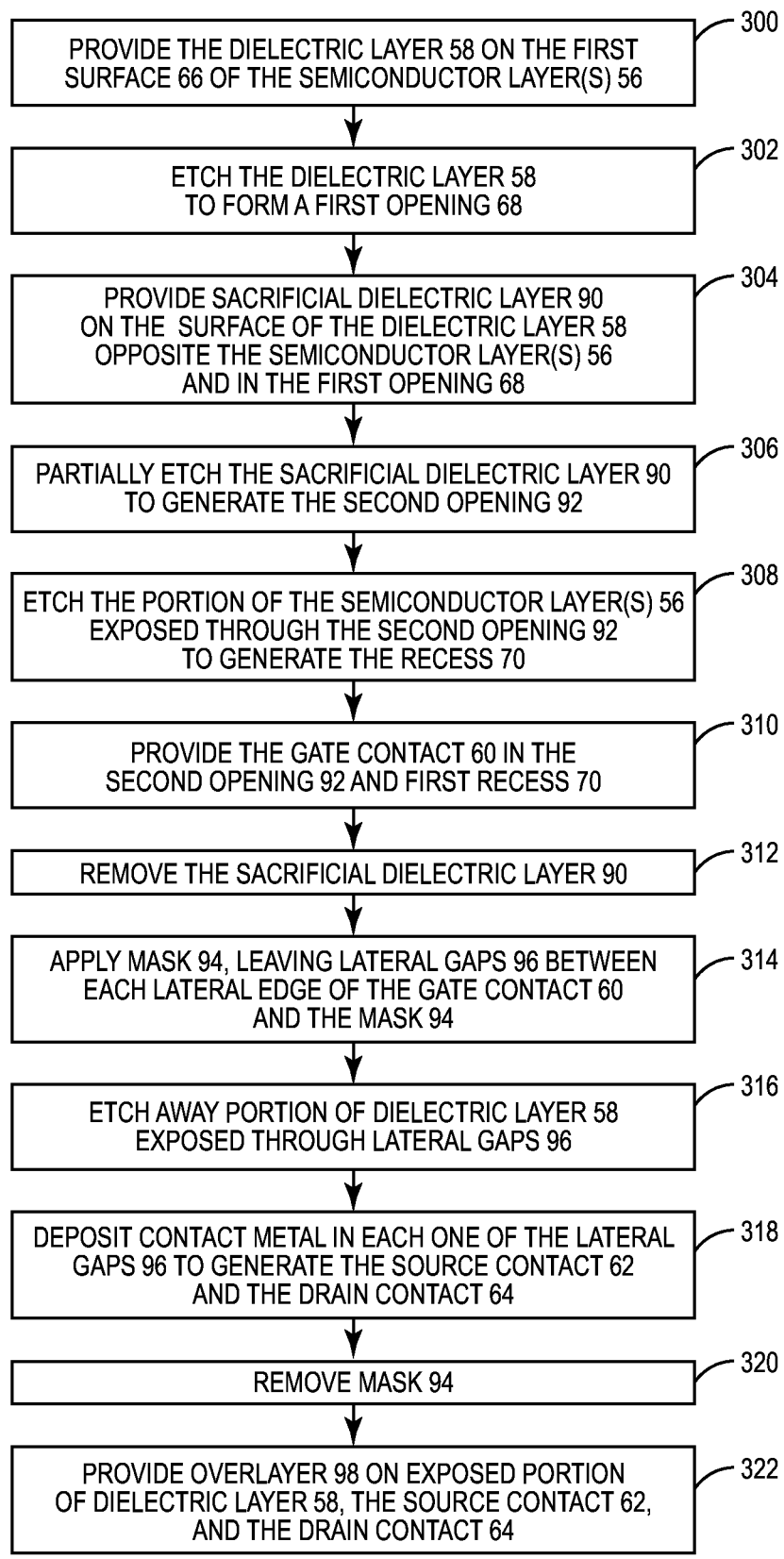
FIG. 5 shows a flow-chart illustrating a process for manufacturing the Schottky barrier device shown in FIG. 4 according to one embodiment of the present disclosure.

FIG. 5 and corresponding FIGS. 6A through 6L illustrate a method of fabricating the Schottky barrier device shown in FIG. 4 according to one embodiment of the present disclosure. First, the dielectric layer 58 is provided on the first surface 66 of the one or more semiconductor layers 56 (step 300 and FIG. 6A). The dielectric layer 58 is then etched to form the first opening 68 (step 302 and FIG. 6B). In one embodiment, a photo-resist etching process is used to generate the first opening 68, in which a photo-mask is applied on the surface of the dielectric layer 58, patterned, and the dielectric layer 58 is etched. Those of ordinary skill in the art will appreciate that many different processes may exist for etching the dielectric layer 58 to generate the first opening 68, all of which are contemplated herein. A sacrificial dielectric layer 90 is then provided on the surface of the dielectric layer 58 opposite the one or more semiconductor layers 56 and in the first opening 68 (step 304 and FIG. 6C). The sacrificial dielectric layer 90 is then partially etched to generate a second opening 92, through which a second portion of the first surface 66 of the one or more semiconductor layers 56 is exposed (step 306 and FIG. 6D). The second opening 92 is substantially smaller than the first opening 68, such that the second portion of the first surface 66 of the one or more semiconductor layers 56 exposed through the second opening 92 is substantially smaller than the first portion of the first surface 66 of the one or more semiconductor layers 56 exposed through the first opening 68. Further, the second opening 92 is tapered, such that the second opening 92 laterally expands as it extends vertically away from first surface 66 of the one or more semiconductor layers 56. As discussed in co-pending U.S. patent application Ser. No. 13/799,216, which is herein incorporated by reference in its entirety, the sacrificial dielectric layer 90 may comprise multiple layers, each of which responds differently to the etching process in order to generate a desired geometry of the second opening 92.

Figure 6A:
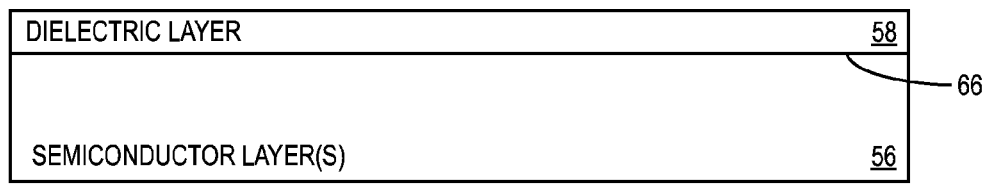
FIGS. 6A-6L illustrate a process for manufacturing the Schottky barrier device shown in FIG. 4 according to one embodiment of the present disclosure.
Figure 6B:
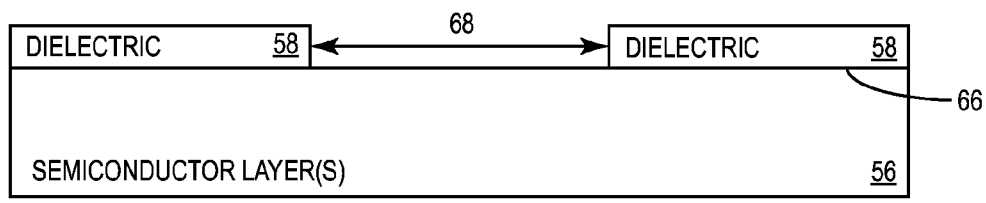
Figure 6C:
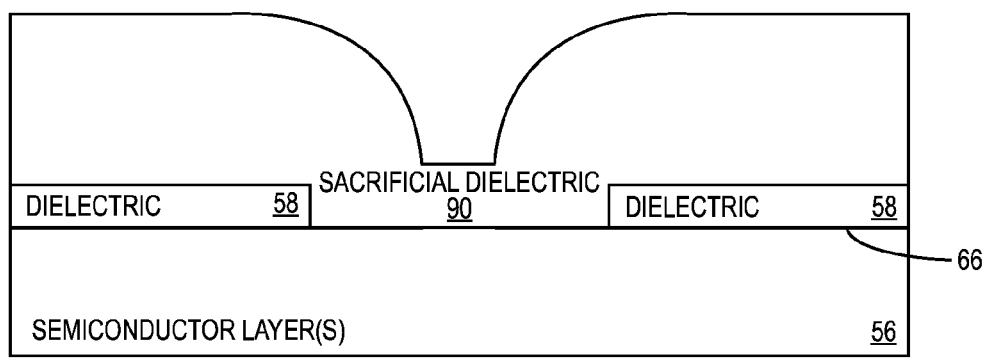
Figure 6D:
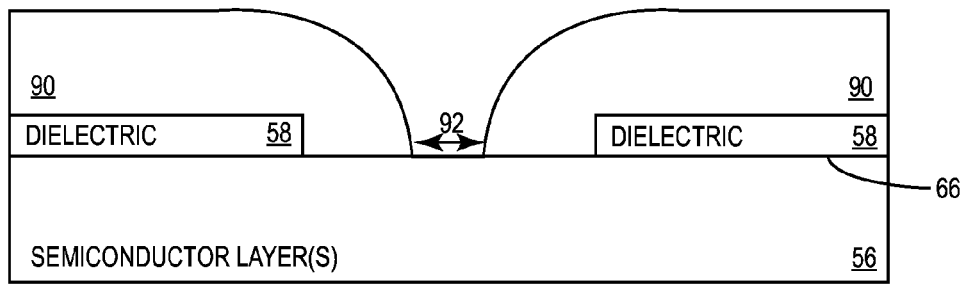
Figure 6E:
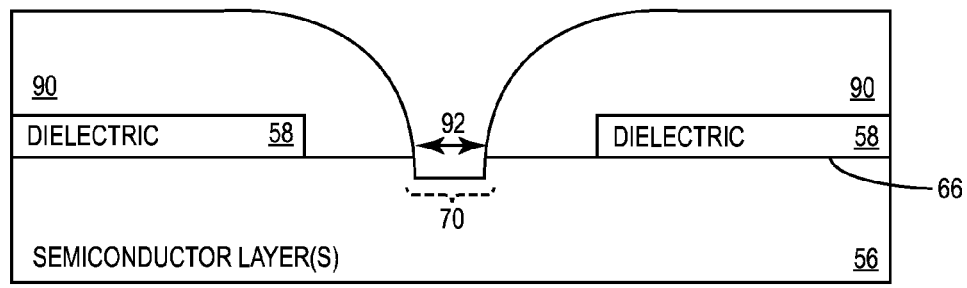

An additional etching process is then performed on the second portion of the first surface 66 of the one or more semiconductor layers 56 to generate the recess 70 in the first surface 66 of the one or more semiconductor layers 56 (step 308 and FIG. 6E). The additional etching process may be a selective etching process designed only to etch the one or more semiconductor layers 56. Those of ordinary skill will appreciate that many different processes may exist for etching the second portion of the first surface 66 of the one or more semiconductor layers 56 to generate the recess 70, all of which are contemplated herein.

Figure 6F:
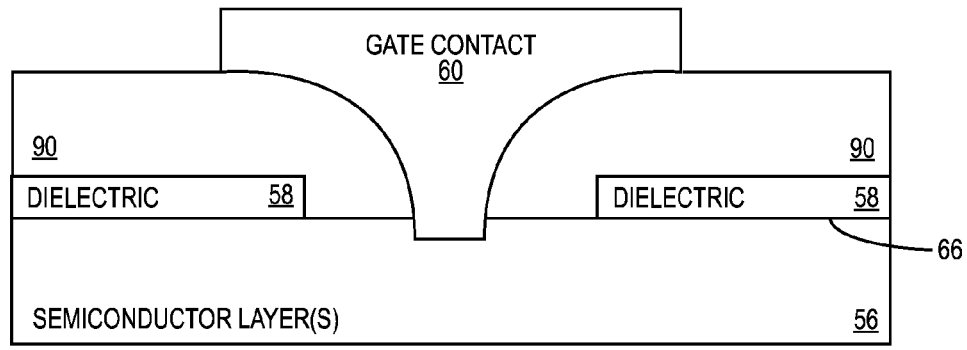
Figure 6G:
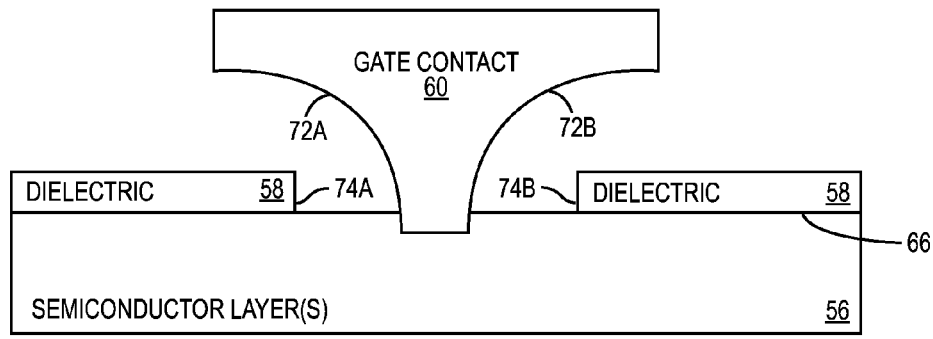
Figure 6H:
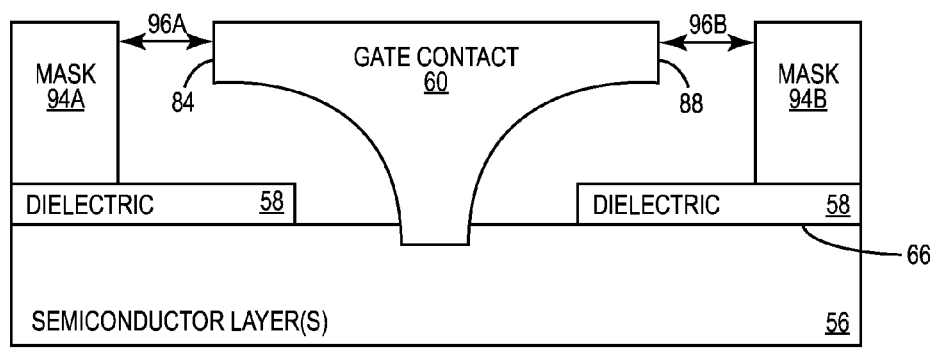
Figure 6I:
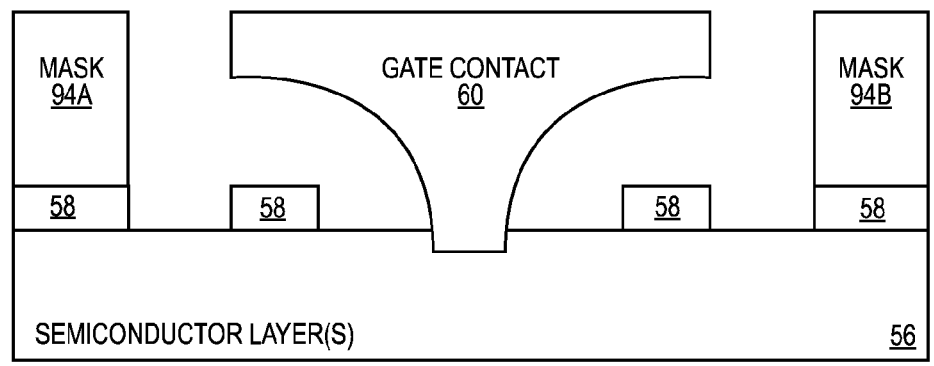
Figure 6J:
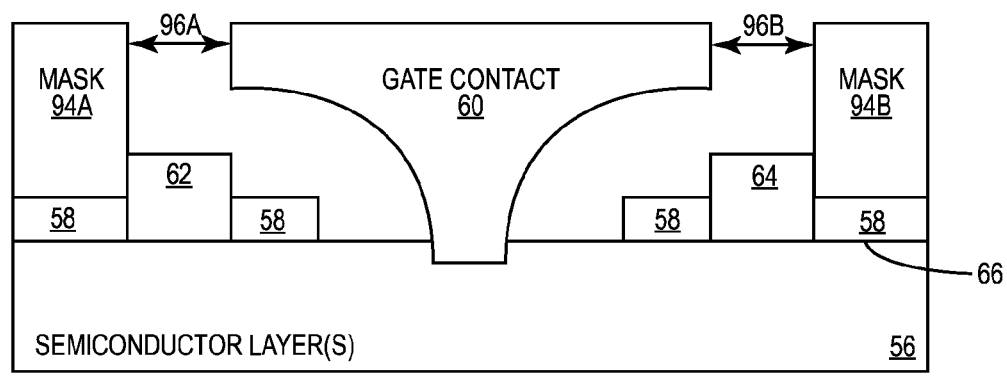
Figure 6K:
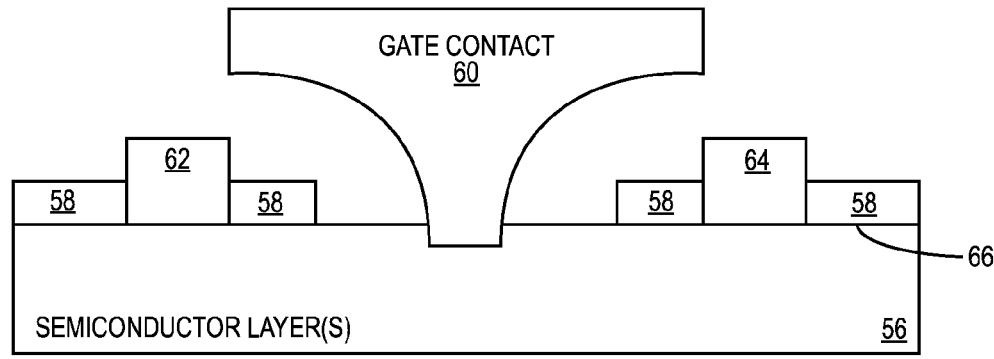
Figure 6L:
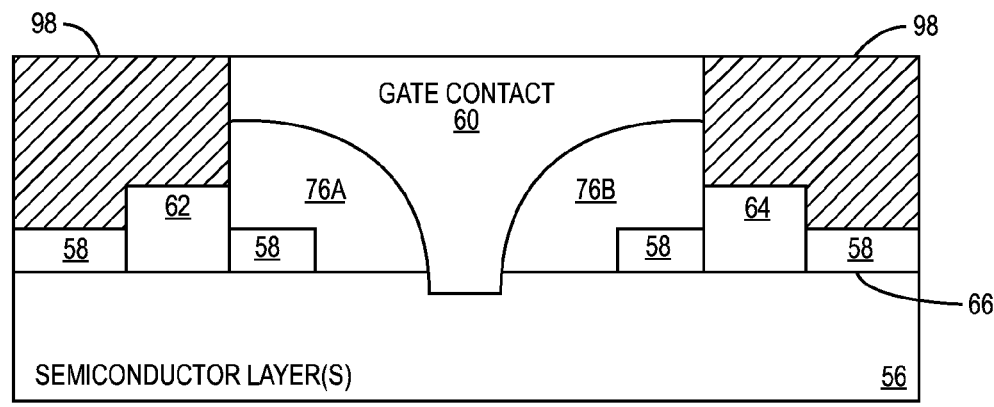

The gate contact 60 is then provided in the second opening 92 and in the recess 70 (step 310 and FIG. 6F). Since the second opening 92 is tapered, the gate contact 60 is also tapered. The gate contact 60 may be provided, for example, by any suitable metal deposition process. As will be understood by those of ordinary skill in the art, a number of processes for providing the gate contact 60 may exist, all of which are contemplated herein. The sacrificial dielectric layer 90 is then removed, thereby generating the air regions 76 between the sidewalls 72 of the gate contact 60 and the sidewalls 74 of the first opening 68 (step 312 and FIG. 6G). In some embodiments, the dielectric layer 58 may also be removed (not shown). A mask 94 is then applied to the outer edges of the Schottky barrier device 54, such that a lateral gap 96 exists between each one of the first lateral edge 84 and the second lateral edge 88 of the gate contact 60 and the mask 94 (step 314 and FIG. 6H). Specifically, a first mask portion 94A is provided, which is separated from the first lateral edge 84 of the gate contact 60 by a first lateral gap 96A, and a second mask portion 94B is provided, which is separated from the second lateral edge 88 of the gate contact 60 by a second lateral gap 96B. In some embodiments where the dielectric layer 58 is not removed, an etching process is then performed to remove the portion of the dielectric layer 58 exposed through the lateral gaps 96 (step 316 and FIG. 6I). A contact metal is then deposited in each one of the lateral gaps 96 between the mask 94 and each one of the first lateral edge 84 and the second lateral edge 88 of the gate contact 60 to generate the source contact 62 and the drain contact 64 (step 318 and FIG. 6J).

Notably, the gate contact 60 is effectively used as part of the mask for generating the source contact 62 and the drain contact 64, thereby allowing the first lateral edge 82 of the source contact 62 to laterally align with the first lateral edge 84 of the gate contact 60, and allowing the first lateral edge 86 of the drain contact 64 to align with the second lateral edge 88 of the gate contact 60. As discussed above, aligning an edge of each one of the source contact 62 and the drain contact 64 with a different edge of the gate contact 60 allows for an improved on resistance ($R_{ON}$) of the Schottky barrier device 54, and may further improve the turn-on voltage ($V_{ON}$) of the Schottky barrier device 54. The mask 94 is then removed, for example, by an etching process (step 320 and FIG. 6K). Those of ordinary skill in the art will appreciate that many different processes exist for removing the mask 94, all of which are contemplated herein. According to one embodiment, an overlayer 98 is then applied to the Schottky barrier device 54, such that the overlayer 98 covers the exposed portions of the dielectric layer 58, the source contact 62, and the drain contact 64, while maintaining the first air region 76A and the second air region 76B (step 322 and FIG. 6L). Accordingly, the Schottky barrier device 54 may be strengthened and protected against environmental exposure. The overlayer 98 may comprise any suitable material. For example, according to one embodiment, the overlayer 52 may comprise a dielectric film that is deposited under highly anisotropic conditions (e.g., sputtered or evaporated). Alternatively, a conformal dielectric layer may also be used as the overlayer 52.

Figure 7:
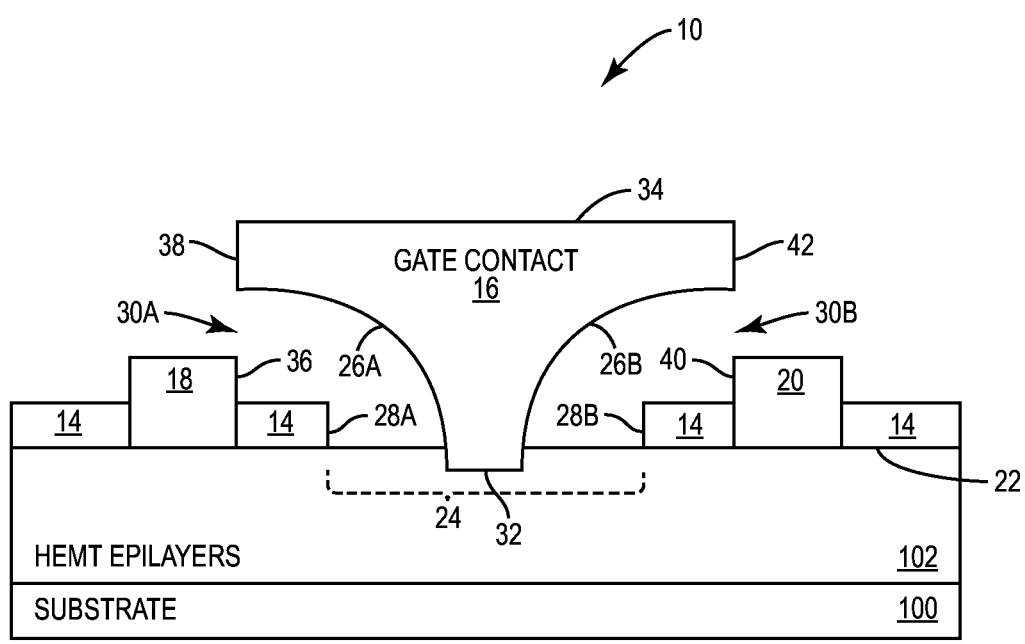
FIG. 7 shows a two-dimensional representation of a Schottky barrier device according to an additional embodiment of the present disclosure.

FIG. 7 shows the Schottky barrier device 10 of FIG. 1 wherein the Schottky barrier device 10 is a high electron mobility transistor (HEMT). The Schottky barrier device 10 shown in FIG. 7 is substantially similar to that shown in FIG. 1, except the one or more semiconductor layers 12 of the Schottky barrier device 10 shown in FIG. 7 are divided into a substrate 100 and a plurality of HEMT epilayers 102. The HEMT epilayers 102 may be provided sequentially on the substrate 100. As will be understood by those of ordinary skill in the art, a two-dimensional electron gas is formed at the interface between the HEMT epilayers 102 and the substrate 100, which creates a channel through which current can flow between the source contact 18 and the drain contact 20. The Schottky interface between the gate contact 16 and the HEMT epilayers 102 controls the amount of current flow in the channel.

Figure 8:
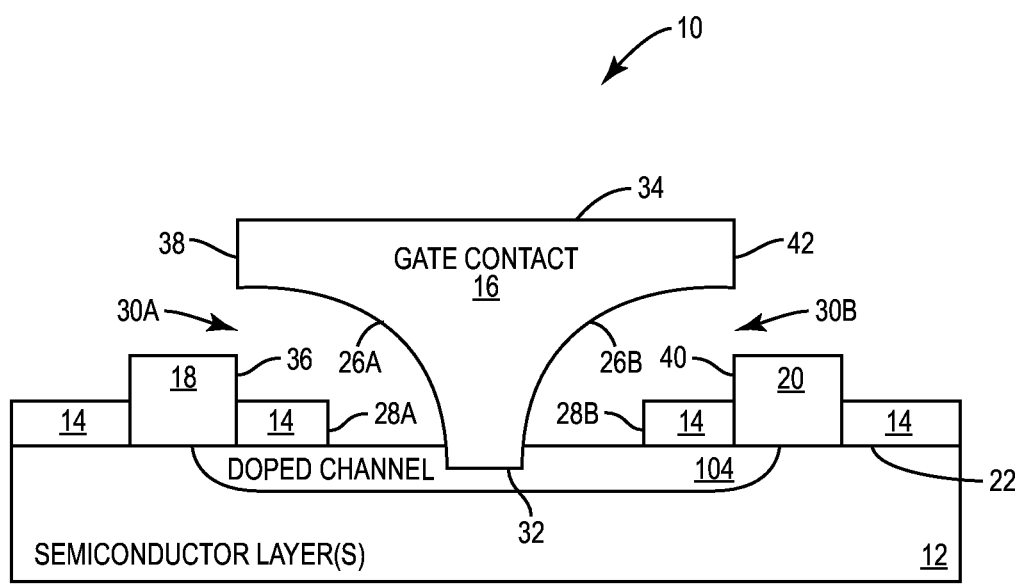
FIG. 8 shows a two-dimensional representation of a Schottky barrier device according to an additional embodiment of the present disclosure.

FIG. 8 shows the Schottky barrier device 10 of FIG. 1 wherein the Schottky barrier device is a metal-semiconductor field-effect transistor (MESFET). The Schottky barrier device 10 shown in FIG. 8 is substantially similar to that shown in FIG. 1, except the one or more semiconductor layers 12 of the Schottky barrier device shown in FIG. 8 include a doped channel 104, which extends between the source contact 18 and the drain contact 20 at the surface of the one or more semiconductor layers 12 in contact with the dielectric layer 14. As will be understood by those of ordinary skill in the art, the doped channel 104 between the source contact 18 and the drain contact 20 enables the flow of current between the contacts. The Schottky interface between the gate contact 16 and the one or more semiconductor layers 12 controls the amount of current flow in the doped channel 104.

Figure 9:
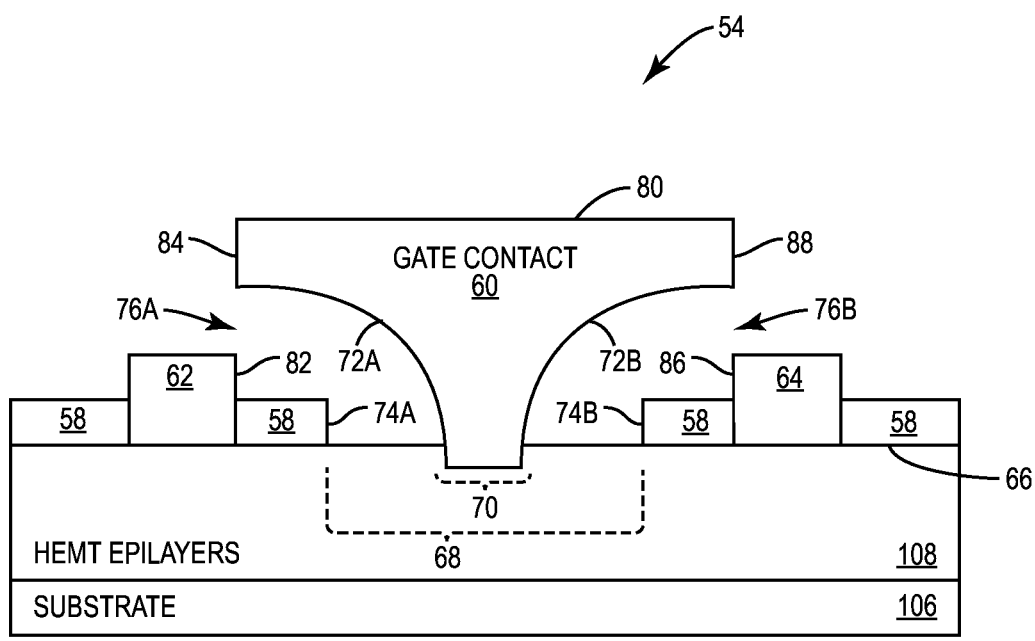
FIG. 9 shows a two-dimensional representation of a Schottky barrier device according to an additional embodiment of the present disclosure.

FIG. 9 shows the Schottky barrier device 54 of FIG. 4 wherein the Schottky barrier device is a HEMT. The Schottky barrier device shown in FIG. 9 is substantially similar to that shown in FIG. 4, except the one or more semiconductor layers 56 of the Schottky barrier device 54 shown in FIG. 9 are divided into a substrate 106 and a plurality of HEMT epilayers 108. The HEMT epilayers 108 may be provided sequentially on the substrate 106. As will be understood by those of ordinary skill in the art, a two-dimensional electron gas is formed at the interface between the HEMT epilayers 108 and the substrate 106, which creates a channel through which current can flow between the source contact 62 and the drain contact 64. The Schottky interface between the gate contact 60 and the HEMT epilayers 108 controls the amount of current flow in the channel.

Figure 10:
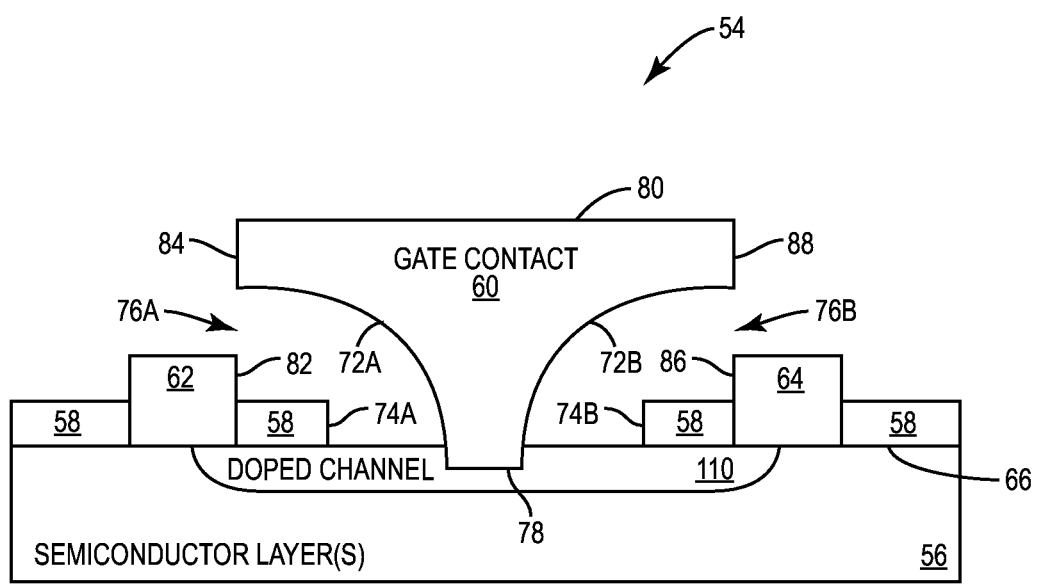
FIG. 10 shows a two-dimensional representation of a Schottky barrier device according to an additional embodiment of the present disclosure.

FIG. 10 shows the Schottky barrier device 54 of FIG. 4 wherein the Schottky barrier device 54 is a MESFET. The Schottky barrier device 54 shown in FIG. 10 is substantially similar to that shown in FIG. 4, except the one or more semiconductor layers 56 of the Schottky barrier device 54 shown in FIG. 10 include a doped channel 110, which extends between the source contact 62 and the drain contact 64 at the surface of the one or more semiconductor layers 56 in contact with the dielectric layer 58. As will be understood by those of ordinary skill in the art, the doped channel 110 between the source contact 62 and the drain contact 64 enables the flow of current between the contacts. The Schottky interface between the gate contact 60 and the one or more semiconductor layers 56 controls the amount of current flow in the doped channel 104.

Those skilled in the art will recognize improvements and modifications to the preferred embodiments of the present disclosure. All such improvements and modifications are considered within the scope of the concepts disclosed herein and the claims that follow.

What is claimed is:

1. A Schottky barrier device comprising:
    one or more semiconductor layers;
    a drain contact and a source contact on a first surface of the one or more semiconductor layers; and
    a gate contact including a proximal end on the first surface of the one or more semiconductor layers between the drain contact and the source contact and a distal end opposite the proximal end, wherein the gate contact is defined by a pair of tapered sidewalls that each expand laterally as the gate contact extends vertically away from the proximal end, terminating into respective ones of a pair of lateral edges at the distal end, such that each lateral edge of the gate contact is laterally aligned with an interior lateral edge of either the drain contact or the source contact, leaving a vertical gap between each lateral edge of the gate contact and the respective interior lateral edge of the drain contact and the source contact,
    wherein a first void extends vertically between the first surface of the one or more semiconductor layers and a first of the tapered sidewalls of the gate contact.

2. The Schottky barrier device of claim 1 further comprising a dielectric layer on one or more exposed portions of the first surface of the one or more semiconductor layers around the drain contact, the source contact, and the gate contact, wherein a lower portion of the first void is between a portion of the dielectric layer that directly contacts the drain contact and a portion of the gate contact that is immediately above the first surface of the one or more semiconductor layers.

3. The Schottky barrier device of claim 2 further comprising:
    an overlayer over the dielectric layer, the source contact, and the drain contact, such that the overlayer maintains the vertical gap between each lateral edge of the gate contact and the respective interior lateral edge of the drain contact and the source contact.

4. The Schottky barrier device of claim 3 wherein:
    the first surface of the one or more semiconductor layers includes a recess, which extends from the surface of the first surface of the one or more semiconductor layers to a desired depth; and
    the gate contact is in contact with the first surface of the one or more semiconductor layers within the recess.

5. The Schottky barrier device of claim 1 wherein each vertical gap between each lateral edge of the gate contact and the interior lateral edge of either the drain contact or the source contact is a vacuum.

6. The Schottky barrier device of claim 1 wherein the one or more semiconductor layers comprise a semiconductor substrate layer and a plurality of high electron mobility transistor (HEMT) epilayers on the semiconductor substrate layer, the plurality of HEMT epilayers providing the first surface, and wherein each of the pair of tapered sidewalls has an arcuate profile.

7. The Schottky barrier device of claim 1 wherein the first surface of the one or more semiconductor layers includes a doped channel extending between the source contact and the drain contact, wherein the gate contact, the source contact, and the drain contact are in contact with the doped channel.

8. The Schottky barrier device of claim 1 wherein the one or more semiconductor layers comprise one of gallium nitride (GaN) and silicon carbide (SiC), and wherein the proximal end of the gate contact has a width less than about 0.2 μm.

9. The Schottky barrier device of claim 8 wherein a lateral distance between the source contact and the drain contact is less than about 0.4 μm.

10. The Schottky barrier device of claim 1 wherein the proximal end of the gate contact has a width less than about 0.1 μm.

11. The Schottky barrier device of claim 1 further comprising:
    an overlayer over the first surface of the one or more semiconductor layers, the source contact, and the drain contact, such that the overlayer maintains the vertical gap between each lateral edge of the gate contact and the respective interior lateral edge of the drain contact and the source contact.

12. The Schottky barrier device of claim 11 wherein:
    the first surface of the one or more semiconductor layers includes a recess, which extends from the surface of the first surface of the one or more semiconductor layers to a desired depth; and
    the proximal end of the gate contact is in contact with the first surface of the one or more semiconductor layers within the recess.

13. The Schottky barrier device of claim 1, further comprising a dielectric layer on one or more exposed portions of the first surface of the one or more semiconductor layers, the dielectric layer directly contacting the interior lateral edges of the drain contact and the source contact that are laterally aligned with the respective lateral edges of the gate contact.

14. The Schottky barrier device of claim 1, wherein a length of the distal end of the gate contact is approximately equal to a distance between the source contact and the drain contact.

15. A Schottky barrier device comprising:
one or more semiconductor layers;
a drain contact and a source contact on a first surface of the one or more semiconductor layers; and
a gate contact including a proximal end on the first surface of the one or more semiconductor layers between the drain contact and the source contact and a distal end opposite the proximal end, wherein the gate contact is defined by a pair of tapered sidewalls that expand laterally as the gate contact extends vertically away from the proximal end, terminating in a pair of lateral edges at the distal end, such that each lateral edge of the gate contact is laterally aligned with an interior lateral edge of either the drain contact or the source contact, leaving a vertical gap between each lateral edge of the gate contact and the respective interior lateral edge of the drain contact and the source contact,
wherein the first surface of the one or more semiconductor layers includes a recess, which extends from the surface of the first surface of the one or more semiconductor layers to a desired depth; and
the proximal end of the gate contact is in contact with the first surface of the one or more semiconductor layers within the recess.

16. The Schottky barrier device of claim 15, further comprising a dielectric layer on one or more exposed portions of the first surface of the one or more semiconductor layers, the dielectric layer directly contacting the interior lateral edges of the drain contact and the source contact that are laterally aligned with the respective lateral edges of the gate contact.

17. The Schottky barrier device of claim 15, further comprising a first void that extends vertically between the first surface of the one or more semiconductor layers and a first of the tapered sidewalls of the gate contact.

18. A method comprising the steps of:
providing one or more semiconductor layers;
providing a gate contact on a first surface of the one or more semiconductor layers, the gate contact including a proximal end on the first surface of the one or more semiconductor layers and a pair of tapered sidewalls that expand laterally as the gate contact extends vertically away from the proximal end, terminating in a pair of lateral edges at a distal end of the gate contact, which is opposite the proximal end; and
using the gate contact as a mask to deposit a drain contact and a source contact, such that the drain contact and the source contact each include an interior lateral edge that is laterally aligned with a different lateral edge of the gate contact.

19. The method of claim 18 wherein providing the gate contact on the first surface of the one or more semiconductor layers comprises:
providing a dielectric layer on the first surface of the one or more semiconductor layers;
forming a first opening in the dielectric layer, through which a first portion of the one or more semiconductor layers is exposed; and
providing the gate contact on the first surface of the one or more semiconductor layers exposed through the first opening.

20. The method of claim 19 wherein providing the gate contact on the first surface of the one or more semiconductor layers further comprises:
providing a sacrificial dielectric layer on a surface of the dielectric layer opposite the one or more semiconductor layers and in the first opening;
etching the sacrificial dielectric layer to form a second opening, through which a second portion of the one or more semiconductor layers is exposed, wherein the second opening is tapered, such that the second opening expands laterally as it extends vertically away from the one or more semiconductor layers;
providing the gate contact in the second opening; and
removing the sacrificial dielectric layer.

21. The method of claim 19 wherein providing the gate contact on the first surface of the one or more semiconductor layers further comprises:
providing a sacrificial dielectric layer on a surface of the dielectric layer opposite the one or more semiconductor layers and in the first opening;
etching the sacrificial dielectric layer to form a second opening, through which a second portion of the one or more semiconductor layers is exposed, wherein the second opening is tapered, such that the second opening expands laterally as it extends vertically away from the one or more semiconductor layers;
etching the second portion of the one or more semiconductor layers to form a recess;
providing the gate contact in the second opening and recess; and
removing the sacrificial dielectric layer.

22. The method of claim 19 wherein providing the gate contact on the first surface of the one or more semiconductor layers further comprises removing the dielectric layer.

23. The method of claim 19 wherein using the gate contact as a mask to deposit the source contact and the drain contact comprises:
providing a mask on the surface of the dielectric layer opposite the one or more semiconductor layers, such that the mask includes the one or more lateral gaps between each edge of the gate contact and the mask, through which a portion of the surface of the dielectric layer is exposed;
etching the portion of the dielectric layer exposed through the one or more lateral gaps to expose the first surface of the one or more semiconductor layers;
providing the source contact and the drain contact, respectively, in one of the lateral gaps formed between the edge of the gate contact and the mask; and
removing the mask.

24. The method of claim 19, wherein a first lateral edge of the gate contact is separated by a first vertical gap from an interior lateral edge of the drain contact and a second lateral edge of the gate contact is separated by a second vertical gap from an interior lateral edge of the source contact.

25. The method of claim 18 wherein the one or more semiconductor layers comprise a semiconductor substrate layer and a plurality of high electron mobility transistor (HEMT) epilayers on the semiconductor substrate layer, the HEMT epilayers providing the first surface.

26. The method of claim 18 wherein the first surface of the one or more semiconductor layers includes a doped channel extending between the source contact and the drain contact, wherein the gate contact, the source contact, and the drain contact are in contact with the doped channel.

27. The method of claim 18 wherein the proximal end of the gate contact has a width less than about 0.2 μm.

28. The method of claim 27 wherein a lateral distance between the source contact and the drain contact is less than about 0.4 μm.

29. The method of claim 18 wherein a lateral distance between the source contact and the drain contact is less than about 0.4 μm.

30. The method of claim 18 wherein the one or more semiconductor layers comprise one of gallium nitride (GaN) and silicon carbide (SiC).

31. The method of claim 18 wherein using the gate contact as a mask to deposit the source contact and the drain contact comprises:
- providing a mask on the first surface of the one or more semiconductor layers, such that the mask includes a lateral gap between each edge of the gate contact and the mask, through which a portion of first surface of the one or more semiconductor layers is exposed;
- providing the source contact and the drain contact, respectively, in one of the lateral gaps formed between the edge of the gate contact and the mask; and
- removing the mask.

\* \* \* \* \*